United States Patent
Shim et al.

(10) Patent No.: US 10,475,728 B2
(45) Date of Patent: Nov. 12, 2019

(54) APPARATUS FOR BONDING FLEXIBLE PART INCLUDING INCLINED LEADS

(71) Applicant: PROTEC CO., LTD., Gyeonggi-do (KR)

(72) Inventors: Moo Sup Shim, Seoul (KR); Seong Yong Ji, Seoul (KR); Hyoung Yeon Ju, Daejeon (KR); Chiho Cho, Incheon (KR)

(73) Assignee: PROTEC CO., LTD., Gyeonggi-do (KR)

( * ) Notice: Subject to any disclaimer, the term of this patent is extended or adjusted under 35 U.S.C. 154(b) by 55 days.

(21) Appl. No.: 15/896,029

(22) Filed: Feb. 13, 2018

(65) Prior Publication Data
US 2018/0342445 A1   Nov. 29, 2018

(30) Foreign Application Priority Data

May 24, 2017   (KR) .................. 10-2017-0064317

(51) Int. Cl.
| | | |
|---|---|---|
| *H01L 23/495* | (2006.01) | |
| *B23K 3/08* | (2006.01) | |
| *H01L 23/00* | (2006.01) | |
| *H05K 13/00* | (2006.01) | |
| *H05K 3/34* | (2006.01) | |
| *H01L 23/498* | (2006.01) | |

(52) U.S. Cl.
CPC .......... *H01L 23/49555* (2013.01); *B23K 3/08* (2013.01); *H01L 23/49838* (2013.01); *H01L 24/66* (2013.01); *H01L 24/80* (2013.01); *H05K 3/3426* (2013.01); *H05K 13/0015* (2013.01); *H05K 13/0076* (2013.01)

(58) Field of Classification Search
CPC ................................................ H01L 23/49555
See application file for complete search history.

(56) References Cited

U.S. PATENT DOCUMENTS

2016/0250704 A1   9/2016 Azdasht
2018/0211932 A1*  7/2018 Woo

* cited by examiner

*Primary Examiner* — Daniel H Lee
(74) *Attorney, Agent, or Firm* — JCIPRNET

(57) ABSTRACT

An apparatus for bonding a flexible part including inclined leads is provided, more particularly, an apparatus for bonding a flexible part including inclined leads, which aligns parts to bond the parts is provided. According to the apparatus for bonding a flexible part including inclined leads, an electronic part may be easily bonded to a part having an inclined surface.

8 Claims, 11 Drawing Sheets

APPARATUS FOR BONDING FLEXIBLE PART INCLUDING INCLINED LEADS

CROSS-REFERENCE TO RELATED APPLICATION

This application claims the benefit of Korean Patent Application No. 10-2017-0064317, filed on May 24, 2017, in the Korean Intellectual Property Office, the disclosure of which is incorporated herein in its entirety by reference.

BACKGROUND

1. Field

One or more embodiments relate to an apparatus for bonding a flexible part including inclined leads, and more particularly, to an apparatus for bonding a flexible part including inclined leads, which aligns parts to bond the parts.

2. Description of the Related Art

Various methods are used to bond an electronic part such as a semiconductor chip to parts such as a substrate. A flip-chip type semiconductor chip may be temporarily bonded to a board by using flux, and then the electronic part may be bonded via a reflow process, or the electronic part may be bonded through wire bonding.

The bonding methods according to the related art as described above are typically based on the assumption that an electronic part or a lead of the electronic part that is to be bonded to a board (part) and the board are placed to horizontally face each other.

Recently, as the usage of electronic parts has diversified, sometimes a substrate and an electronic part are tilted with respect to each other. In addition, sometimes the need has arisen to bond a lead that electrically connects an electronic part to a substrate, to an inclination surface that is inclined with respect to a plane where the substrate is placed.

Thus, a novel apparatus for effectively bonding a part having an inclined lead to a substrate is required.

SUMMARY

One or more embodiments include an apparatus for bonding a flexible part including inclined leads, whereby an electronic part may be effectively bonded to an inclined bonding surface.

Additional aspects will be set forth in part in the description which follows and, in part, will be apparent from the description, or may be learned by practice of the presented embodiments.

According to one or more embodiments, an apparatus for bonding a flexible part including inclined leads is included, wherein the apparatus bonds at least one inclined lead of a first part inclined with respect to a plane where the first part and a second part face each other, to at least one inclined pad of the second part formed to face the at least one inclined lead, and the apparatus includes: a base; a support bracket rotatably mounted with respect to the base; a first fixing member clamping the first part; a second fixing member clamping the second part; a first transporting unit transporting the first fixing member relative to the support bracket in a direction in which the first fixing member moves near the second part clamped by the second fixing member; a second transporting unit transporting the second fixing member relative to the support bracket such that a location of the second part is aligned with respect to the first part clamped by the first fixing member; a bonding head bonding the at least one inclined lead of the first part to the at least one inclined pad of the second part; and a tilt unit rotating the support bracket with respect to the base such that the at least one inclined lead of the first part and the at least one inclined pad of the second part face the bonding head.

BRIEF DESCRIPTION OF THE DRAWINGS

These and/or other aspects will become apparent and more readily appreciated from the following description of the embodiments, taken in conjunction with the accompanying drawings.

FIGS. 4A, 5A, 6A through 7 are views for describing an operation of the apparatus for bonding a flexible part including inclined leads illustrated in FIG. 1.

DETAILED DESCRIPTION

Figure 1:
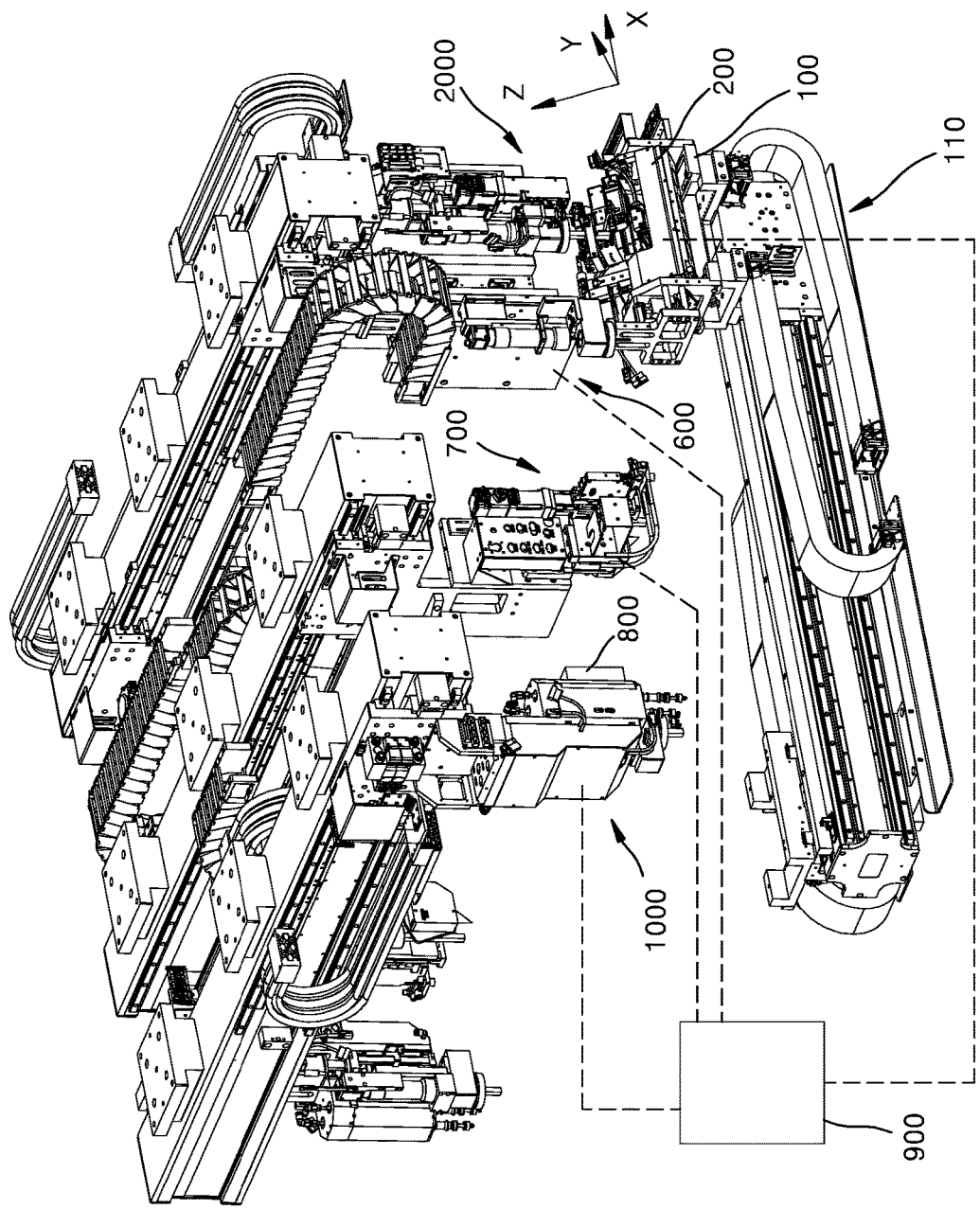
FIG. 1 is a perspective view of an apparatus for bonding a flexible part including inclined leads, according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, an apparatus for bonding a flexible part including inclined leads according to an embodiment of the present disclosure will be described with reference to the attached drawings.

Figure 2A:
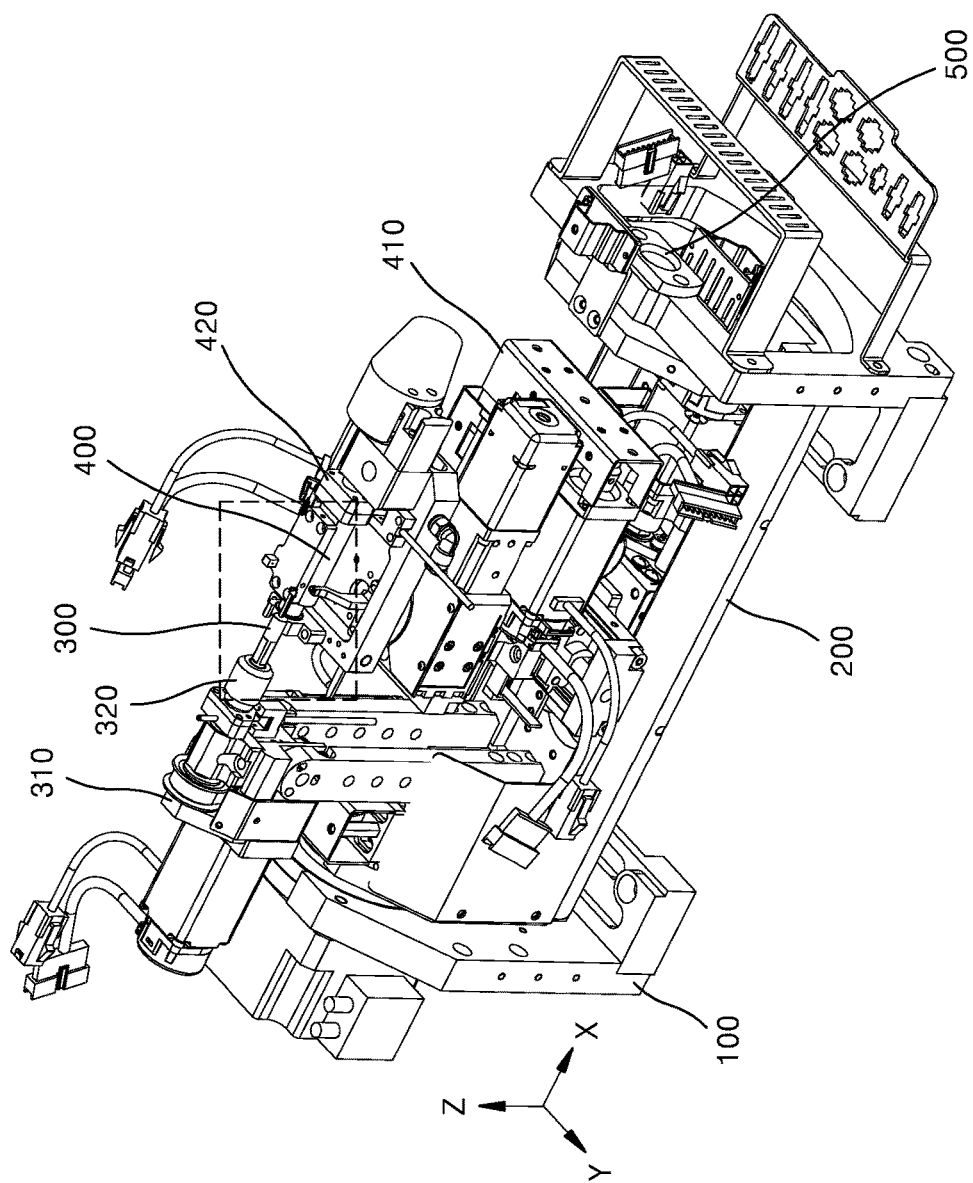
FIG. 2A is a perspective view of a portion of an apparatus illustrated in FIG. 1 for bonding a flexible part including an inclined lead.
Figure 2B:
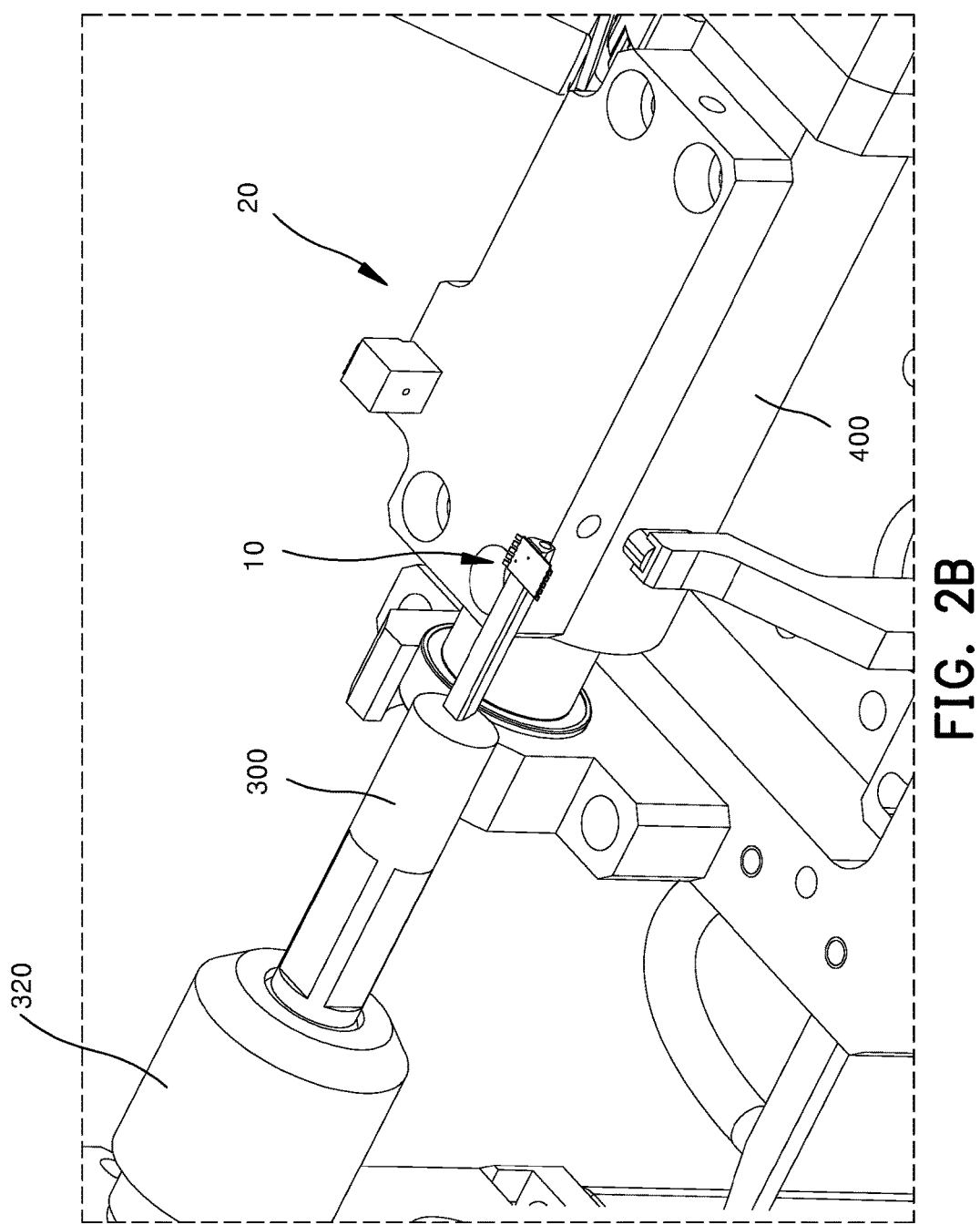
FIG. 2B is a partial enlarged perspective view of FIG. 2A.

FIG. 1 is a perspective view of an apparatus for bonding a flexible part including inclined leads, according to an embodiment of the present disclosure. FIG. 2A is a partial perspective view of an apparatus for bonding a flexible part including inclined leads, illustrated in FIG. 1. FIG. 2B is a partial enlarged perspective view of FIG. 2A.

First, parts used in the apparatus for bonding a flexible part including inclined leads, according to the present embodiment, will be described with reference to FIG. 3.

A first part 10 includes a main body 11, a plurality of inclined leads 12, and a plurality of horizontal leads 13. The first part 10 includes the plurality of inclined leads 12 at a side surface of the main body 11 and the plurality of horizontal leads 13 at the opposite side surface of the main body 11. Referring to FIG. 3, the inclined leads 12 are inclined with respect to the main body 11. The horizontal leads 13 are placed to be horizontal to the main body 11. An angle of the inclined leads 12 with respect to the main body 11 is fixed, but an error in the actual angle of the inclined leads 12 may be generated during the manufacturing process of the first part 10.

A second part 20 includes a bonding portion 21, a plurality of inclined pads 22, and a plurality of horizontal pads 23. Referring to FIG. 3, the bonding portion 21 of the second part 20 is planarly formed to face the main body 11 of the first part 10. The inclined pads 22 are inclined with respect to the bonding portion 21. An angle between the inclined pads 22 and the second part 20 is identical to the angle between the inclined leads 12 and the main body 11 of the first part 10 described above. The horizontal pads 23 are formed to be parallel to the bonding portion 21.

Figure 3:
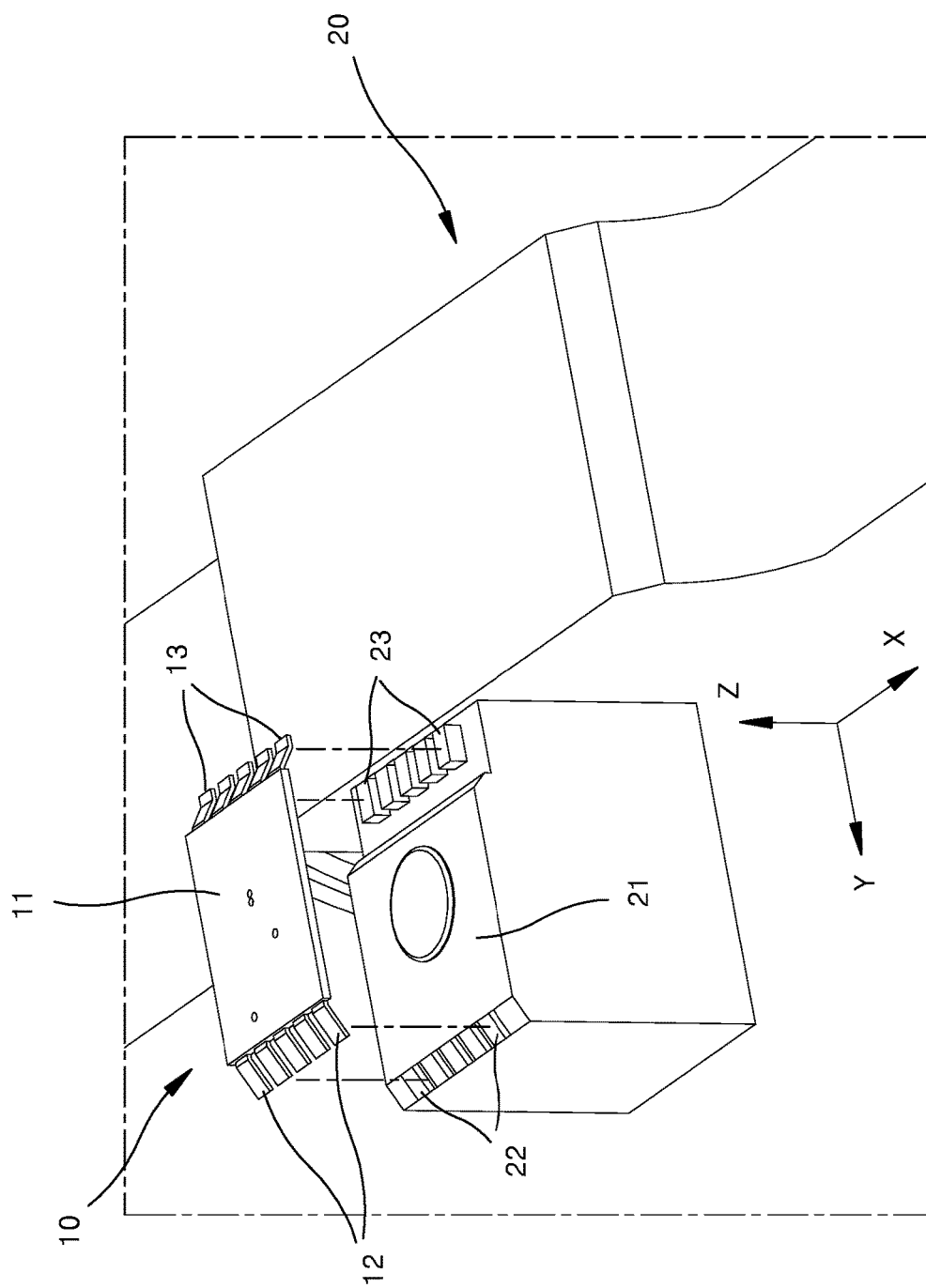
FIG. 3 is a perspective view of a first part and a second part that are bonded using the apparatus for bonding a flexible part including inclined leads, illustrated in FIG. 1.

Referring to FIG. 3, the plurality of inclined leads 12 of the first part 10 are respectively bonded to the plurality of inclined pads 22 of the second part 20. Due to the above-described structure of the first part 10 and the second part 20, the inclined leads 12 and the inclined pads 22 are respectively inclined with respect to a plane where the main body 11 of the first part 10 and the bonding portion 21 of the second part 20 face each other. The plurality of horizontal leads 13 of the first part 10 are respectively bonded to the plurality of horizontal pads 23 of the second part 20. The horizontal leads 13 and the horizontal pads 23 are formed to be parallel to the plane where the main body 11 of the first part 10 and the bonding portion 21 of the second part 20 face each other.

According to the apparatus for bonding a flexible part including inclined leads according to the present disclosure, an arrangement angle between the first part 10 and the second part 20 may be easily adjusted, and thus, the inclined leads 12 and the inclined pads 22 may be effectively bonded.

Next, a configuration of the apparatus for bonding a flexible part including inclined leads of the present embodiment will be described with reference to FIGS. 1, 2A and 2B. Hereinafter, an X-direction, a Y-direction, and a Z-direction are defined and illustrated with respect to a support bracket 200. Axes of coordinates illustrated in FIGS. 1 through 7 are also defined with respect to the support bracket 200.

Referring to FIG. 1, the apparatus for bonding a flexible part including inclined leads according to the present disclosure includes a base 100, the support bracket 200, a tilt unit 500, a first fixing member 300, a first transporting unit 310, a first rotating unit 320, a second fixing member 400, a second transporting unit 410, a second rotating unit 420, a bonding head 600, a pump head 700, an inspection camera 800, and a controller 900.

The base 100 supports the apparatus for bonding a flexible part including inclined leads according to the present embodiment over all. The base 100 may preferably be formed of a rigid metal frame.

The support bracket 200 is mounted on the base 100. The support bracket 200 is rotatably mounted with respect to the base 100.

The tilt unit 500 is mounted over the base 100. The tilt unit 500 rotates the support bracket 200 with respect to the base 100 about a rotational axis in the X-direction, thereby adjusting an angle of the support bracket 200.

According to the apparatus for bonding a flexible part including inclined leads of the present embodiment, the first fixing member 300 has a shape extending in the X-direction. An adsorption hole is formed in one end of the first fixing member 300. The first fixing member 300 clamps the main body 11 of the first part 10 through the adsorption hole by using a vacuum adsorption method.

The first fixing member 300 is liftably mounted with respect to the support bracket 200 in the Z-direction. The first transporting unit 310 lifts the first fixing member 300 with respect to the support bracket 200 in the Z-direction. When the first transporting unit 310 lowers the first fixing member 300 in the Z-direction, the first part 10 clamped by the first fixing member 300 moves near the second part 20.

The first rotating unit 320 is mounted between the first fixing member 300 and the first transporting unit 310. The first rotating unit 320 rotates the first fixing member 300 with respect to the first transporting unit 310 to thereby adjust an angle of the first part 10. According to the present embodiment, the first rotating unit 320 rotates the first fixing member 300 with respect to the rotational axis in the X-direction.

The second fixing member 400 clamps the second part 20. According to the present embodiment, the second fixing member 400 fixes the second part 20 by inserting the second part 20 into a recess having a shape corresponding to that of the second part 20 and adsorbing the second part 20.

The second fixing member 400 is movably mounted relative to the support bracket 200. That is, the second fixing member 400 is movably mounted to the support bracket 200 in the X-direction and the Y-direction with respect to the support bracket 200, and rotatably mounted with respect to each of a rotational axis in the X-direction and a rotational axis in the Y-direction.

The second transporting unit 410 is mounted between the support bracket 200 and the second fixing member 400. The second transporting unit 410 transports the second fixing member 400 with respect to the support bracket 200 in the X-direction and the Y-direction.

The second transporting unit 410 transports the second fixing member 400 with respect to the support bracket 200 in the X-direction and the Y-direction to thereby align a location of the second part 20 relative to the first part 10. As the location of the second part 20 is adjusted via operation of the second transporting unit 410, the second part 20 is located at a position corresponding to the first part 10.

The second rotating unit 420 is mounted between the second transporting unit 410 and the second fixing member 400. The second rotating unit 420 rotates the second fixing member 400 with respect to the support bracket 200 about a rotational axis in the X-direction and a rotational axis in the Y-direction. An angle of the second part 20 clamped by the second fixing member 400 is adjusted via a rotational operation of the second rotating unit 420. Accordingly, the bonding portion 21 of the second part 20 and the main body 11 of the first part 10 may be aligned to be in parallel with each other.

The bonding head 600 is disposed above the first fixing member 300 and the second fixing member 400. According to the present embodiment, the bonding head 600 having a structure as disclosed in US patent application publication 2016/0250704 (Sep. 1, 2016) is used. That is, the bonding head 600 that bonds parts by instantaneously melting spherical solder balls that pass by a capillary and ejecting the melted solder balls to a bonding point is used.

The pump head 700 is disposed above the first fixing member 300 and the second fixing member 400. According to the present embodiment, the pump head 700 is configured to coat the second part 20 with an epoxy as an adhesive.

The inspection camera 800 is disposed above the first fixing member 300 and the second fixing member 400. The inspection camera 800 captures an image of each of the first part 10 clamped by the first fixing member 300 and the second part 20 clamped by the second fixing member 400 and transmits the images to the controller 900. The controller 900 determines a location and angle of each of the first part 10 and the second part 20 by using the images received from the inspection camera 800.

The controller 900 controls operations of the first transporting unit 310, the first rotating unit 320, the second transporting unit 410, the second rotating unit 420, and the tilt unit 500 based on the images captured using the inspection camera 800, thereby adjusting and aligning relative locations and angles of the first part 10 and the second part 20.

Hereinafter, an operation of the apparatus for bonding a flexible part including inclined leads according to the present embodiment configured as described above will be described.

The first part 10 is supplied by using a loading unit 1000 that is separately provided, and is clamped via an adsorption hole of the first fixing member 300. As illustrated in FIGS. 2A and 2B, the first fixing member 300 adsorbs the main body 11 of the first part 10 to fix the same. The second part 20 is also supplied using the loading unit 1000 and fixed to the second fixing member 400.

In this state, a base moving device 110 moves the base 100 to be placed under the inspection camera 800, and an image of a fixed state, shape, and angle of the first part 10 is captured by using the inspection camera 800.

First, in order to capture an image of the fixed state of the first part 10, the inspection camera 800 captures an image of the first part 10 while the main body 11 of the first part 10 maintains horizontal, and transmits the image to the controller 900. The controller 900 determines a location and angle of the first part 10 by using the image captured using the inspection camera 800. If the location and angle of the first part 10 are outside an allowable range, the fixed state of the first part 10 is determined as defective, and another first part 10 is loaded to start a new operation.

Figure 4A:
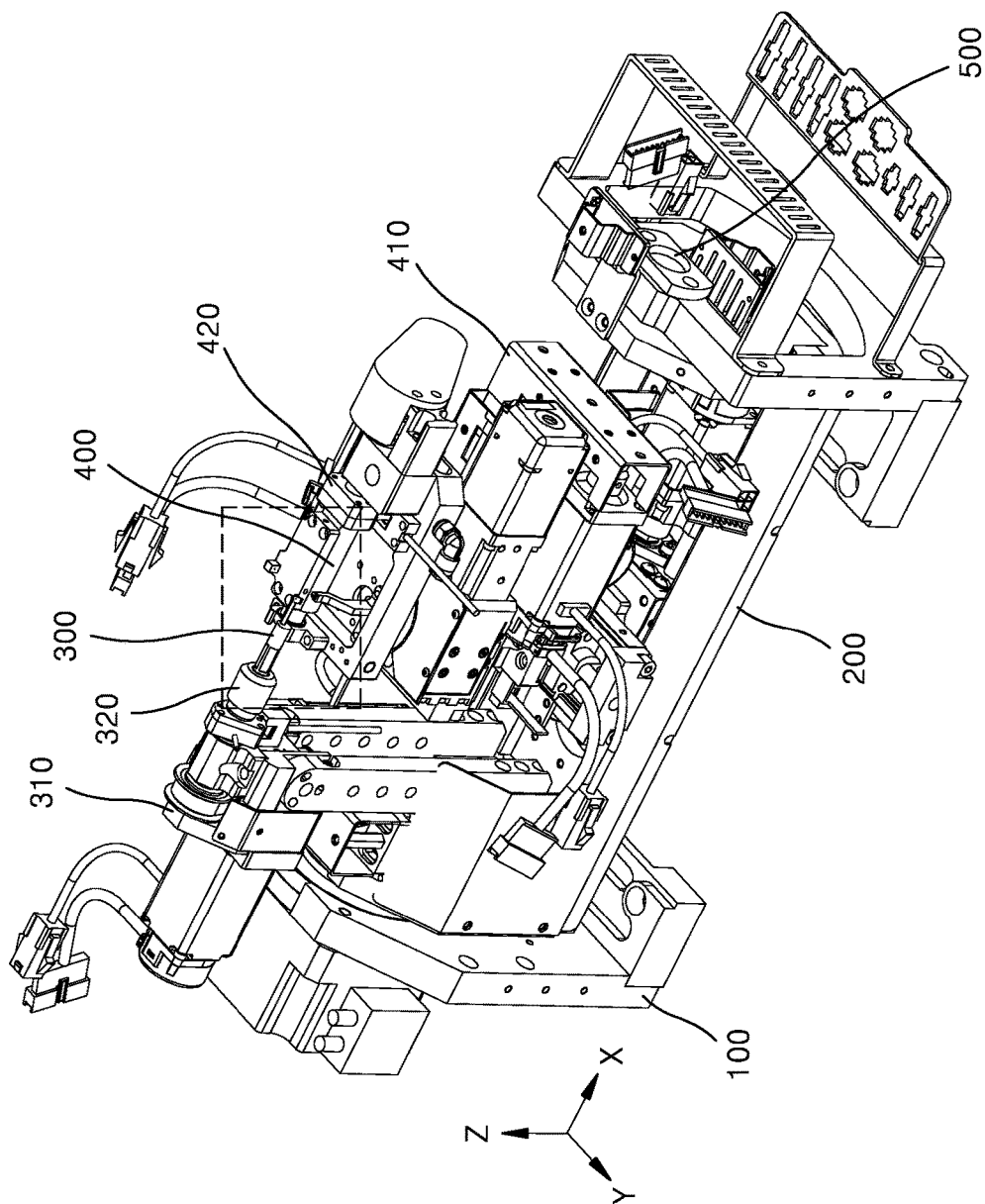
Figure 4B:
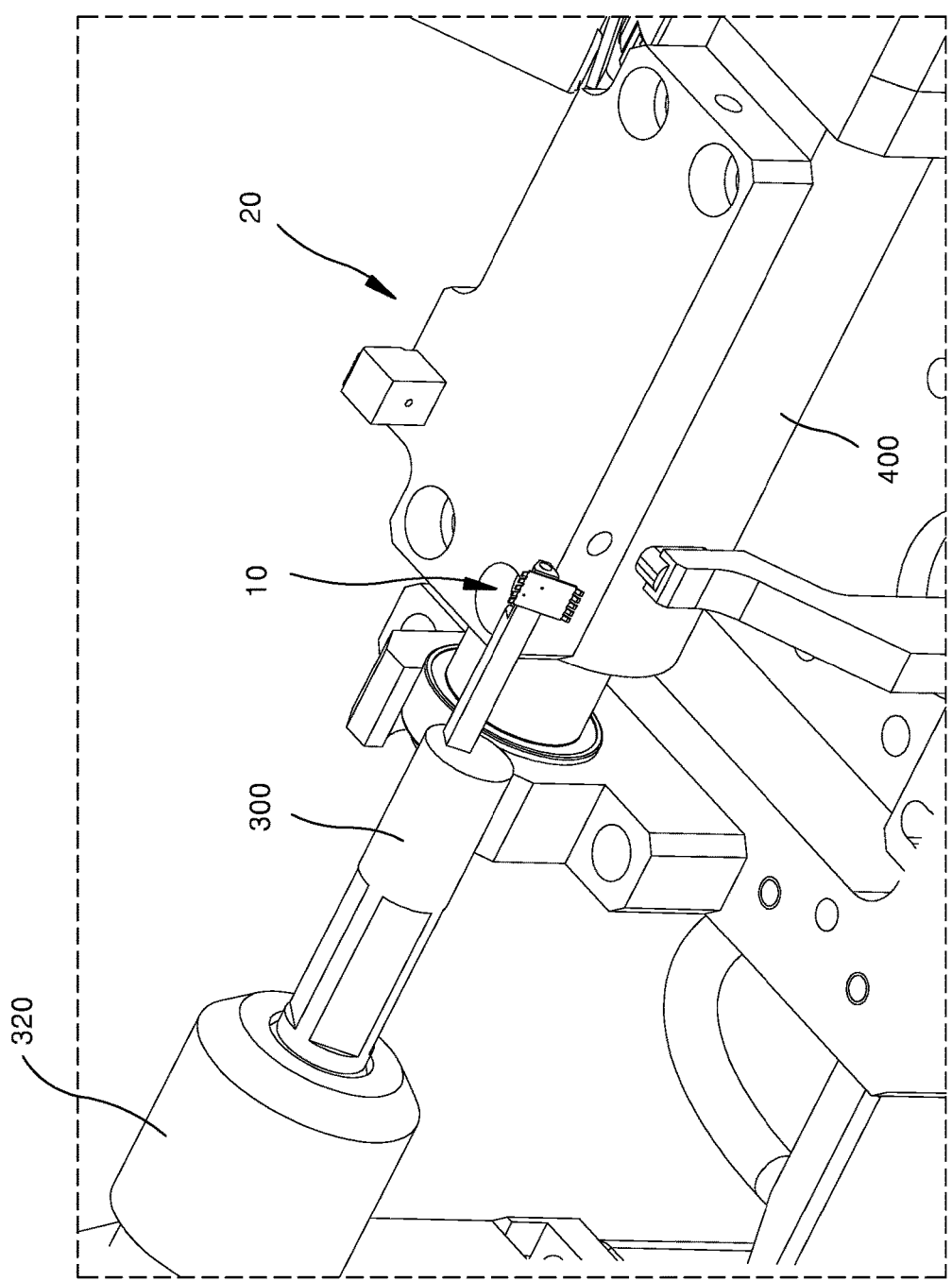
FIGS. 4B, 5B and 6B are partial enlarged perspective views of FIGS. 4A, 5A and 6A, respectively.

FIGS. 4A, 5A, 6A through 7 are views for describing an operation of the apparatus for bonding a flexible part including inclined leads including an inclined lead illustrated in FIG. 1. FIGS. 4B, 5B and 6B are partial enlarged perspective views of FIGS. 4A, 5A and 6A, respectively.

Next, an operation of capturing an image of a shape and angle of the inclined leads 12 of the first part 10 will be described. As illustrated in FIGS. 4A and 4B, the first rotating unit 320 rotates the first fixing member 300 such that the inclined leads 12 of the first part 10 are set in a direction in which they extend upwards. In this state, the inspection camera 800 captures an image of the first part 10 and transmits the image of the inclined leads 12 to the controller 900. The controller 900 calculates heights of the inclined leads 12 by using the image of the first part 10 captured using the inspection camera 800. If there is no difference in the heights of the inclined leads 12, the inclined leads 12 of the first part 10 are normal. If a difference in the heights of the inclined leads 12 is outside an error range, the inclined leads 12 of the first part 10 have a defective structure. In this case, the first part 10 is determined as defective, and a next first part 10 is loaded to start a new operation.

Next, an operation of capturing an image of a shape and angle of the horizontal leads 13 of the first part 10 will be described. The first rotating unit 320 rotates the first fixing member 300 such that the horizontal leads 13 of the first part 10 are set in a direction in which they extend upwards. In this state, the inspection camera 800 captures an image of the first part 10 and transmits the image of the horizontal leads 13 to the controller 900. In the same manner as capturing the images of the inclined leads 12 to determine the same, the controller 900 captures an image of a location and angle of the horizontal leads 13, and if necessary, the controller 900 determines whether the first part 10 is defective or not.

When image capturing of the first part 10 is completed as described above, an image of the second part 20 is captured using the inspection camera 800. The tilt unit 500 and the second rotating unit 420 rotate the second fixing member 400 such that the bonding portion 21 of the second part 20 is horizontal, thereby adjusting an angle of the second part 20. As a result, the bonding portion 21 of the second part 20 faces the inspection camera 800 located above the second fixing member 400. The inspection camera 800 captures an image of the bonding portion 21 of the second part 20 and transmits the image to the controller 900. The controller 900 determines a fixed state, shape, location, and angle of the second part 20 by using the image of the second part 20.

As described above, as the inspection camera 800 captures images of the location and angle of the first part 10 and the second part 20 and information thereof to the controller 900, subsequently, the controller 900 may accurately align relative locations of the first part 10 and the second part 20.

Next, the base moving device 110 moves the base 100 to be placed under the pump head 700. As the second rotating unit 420 has previously rotated the second fixing member 400 such that the bonding portion 21 of the second part 20 is horizontal, the bonding portion 21 of the second part 20 faces the pump head 700 located above the second fixing member 400. In this state, the pump head 700 coats the bonding portion 21 of the second part 20 with an epoxy. An adhesive force of the epoxy coated on the bonding portion 21 of the second part 20 has a function of supporting stable bonding between the first part 10 and the second part 20 later.

Next, an operation of aligning the first part 10 and the second part 20 will be described with reference to FIGS. 5A through 7.

First, the base moving device 110 moves the base 100 to be placed under the bonding head 600. The controller 900 calculates a location difference and an angle difference between the first part 10 and the second part 20 based on image capturing information of the inspection camera 800 described above.

By considering the location difference calculated as described above, the controller 900 adjusts a location of the second part 20 by using the second transporting unit 410. In addition, by considering the angle difference calculated above, the controller 900 adjusts an angle of the second part 20 by using the second rotating unit 420.

Figure 5A:
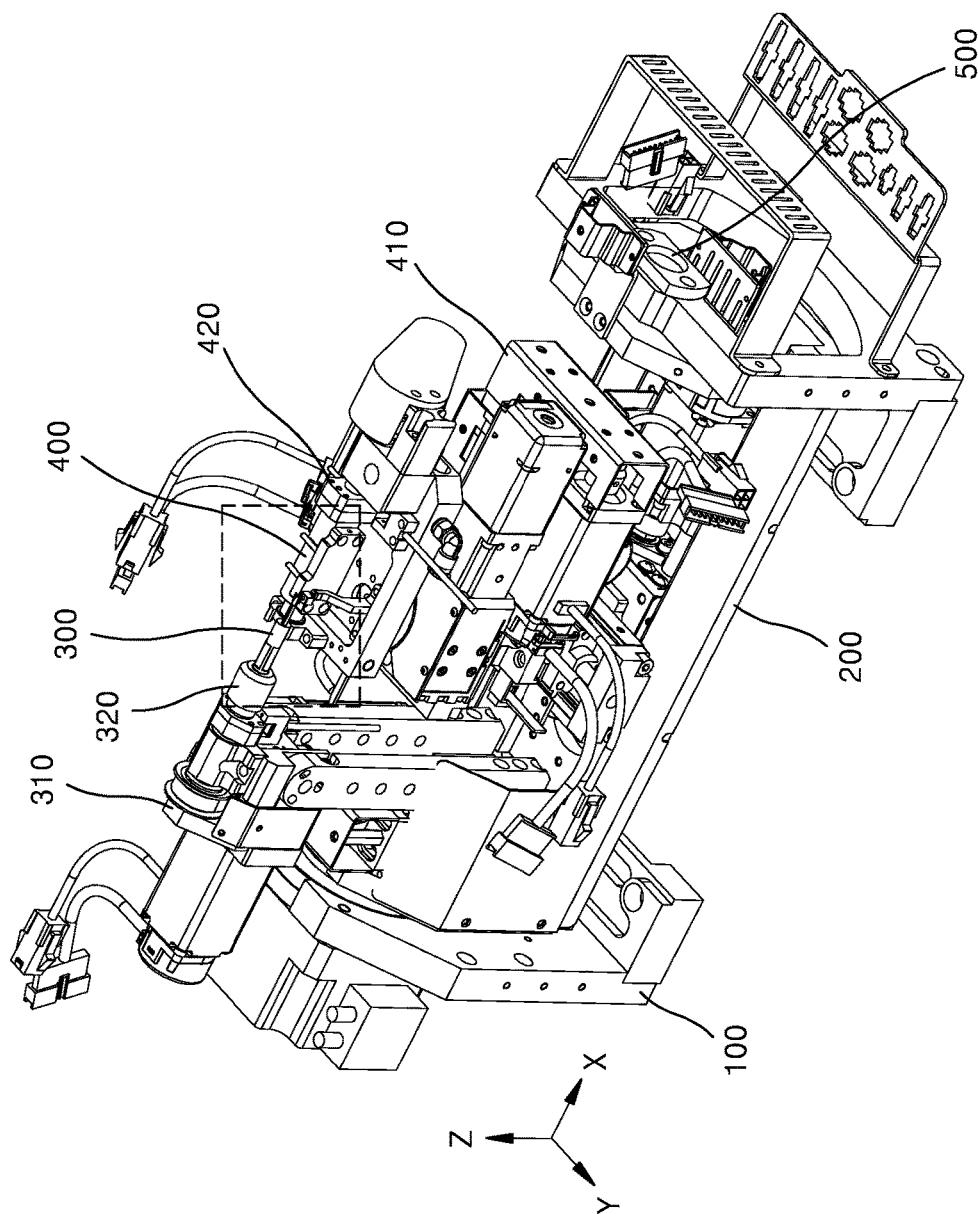
Figure 5B:
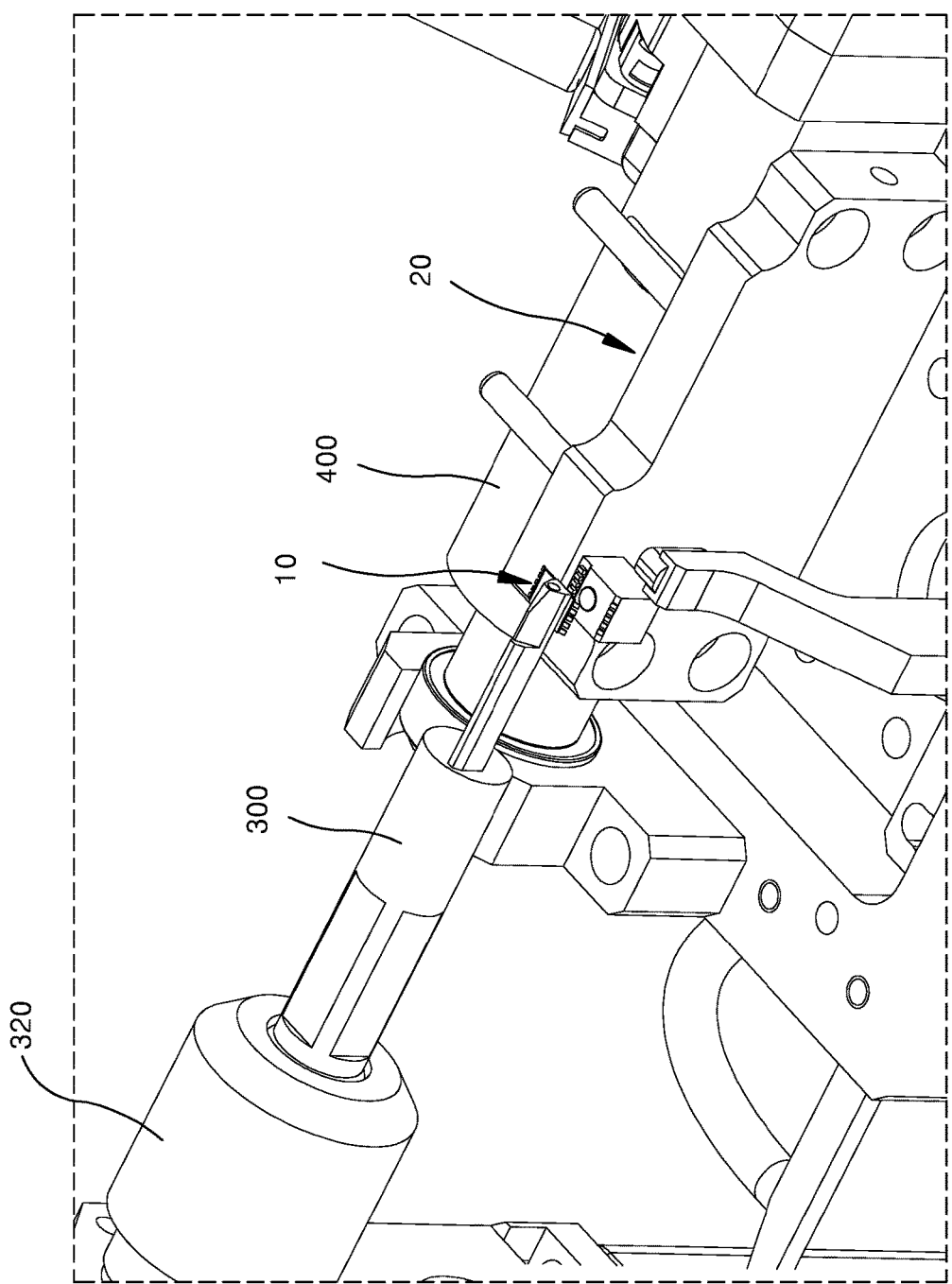

According to the above-described operation, the bonding portion 21 of the second part 20 is aligned to be at an accurate location and in an accurate direction under the main body 11 of the first part 10 as illustrated in FIGS. 5A and 5B. According to the apparatus for bonding a flexible part including inclined leads of the present embodiment, as the controller 900 controls the second transporting unit 410 and the second rotating unit 420 by using image capturing information obtained using the inspection camera 800, the location of the second part 20 may be accurately aligned. The second part 20 is moved along each of an X-axis and a Y-axis and rotated about the X-axis and the Y-axis by using the second transporting unit 410 and the second rotating unit 420, and thus, the location and direction of the second part 20 relative to the first part 10 may be accurately adjusted.

Figure 6A:
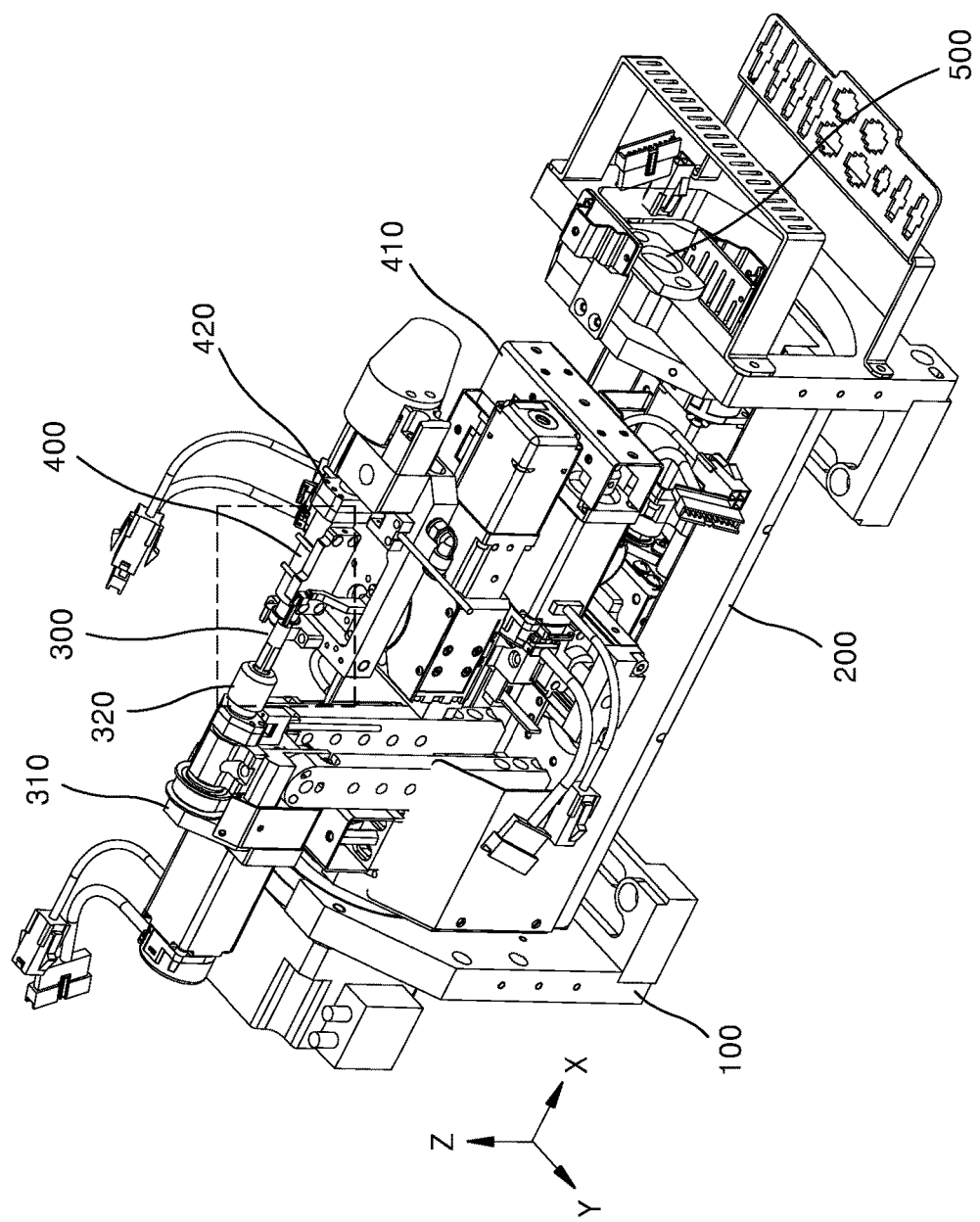
Figure 6B:
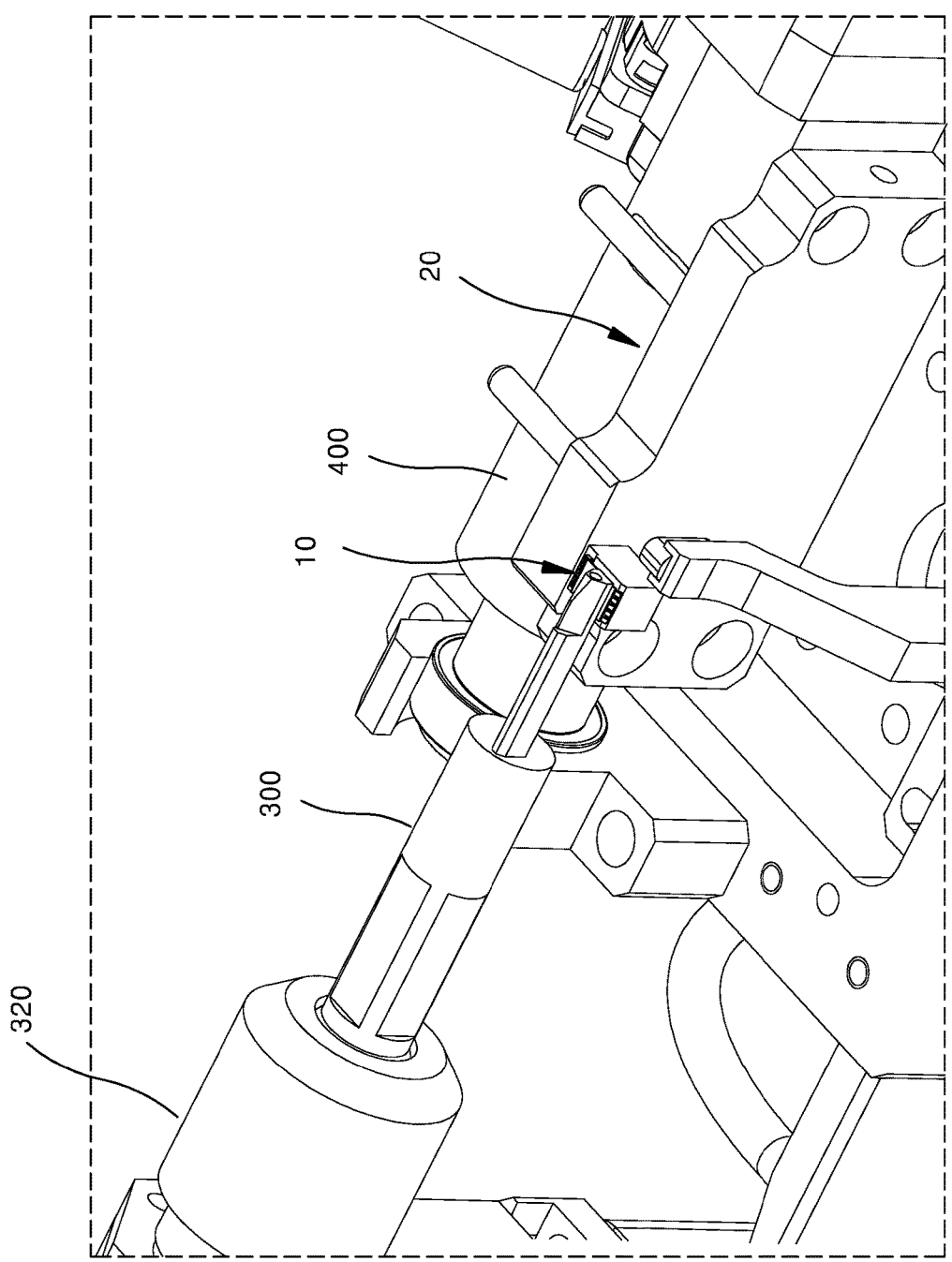

Next, the controller 900 controls the first transporting unit 310 so that the first part 10 moves near the second part 20. The first transporting unit 310 lowers the first fixing member 300 in the Z-direction. When the first fixing member 300 is lowered, the main body 11 of the first part 10 approaches the bonding portion 21 of the second part 20. As the main body 11 of the first part 10 approaches the bonding portion 21 of the second part 20, the inclined leads 12 and the horizontal leads 13 of the first part 10 respectively approach the inclined pads 22 and the horizontal pads 23 of the second part 20. Here, the controller 900 controls the first transporting unit 310 such that a distance between the main body 11 of the first part 10 and the bonding portion 21 of the second part 20 reaches a set distance. According to the above-described control, the plurality of inclined leads 12 and the plurality of horizontal leads 13 of the first part 10 come into contact with the inclined pads 22 and the horizontal pads 23 of the second part 20, respectively. Meanwhile, due to the epoxy coated on the bonding portion 21 of the second part 20 previously, the first part 10 and the second part 20 are bonded to each other. As the epoxy is hardened, an adhesive force between the first part 10 and the second part 20 is intensified. When the above-described aligning operation is completed, the apparatus for bonding a flexible part including an inclined lead according to the present embodiment is in a condition as illustrated in FIGS. 6A and 6B.

Next, an operation of performing bonding performed as the tilt unit 500 rotates the support bracket 200 will be described.

Figure 7:
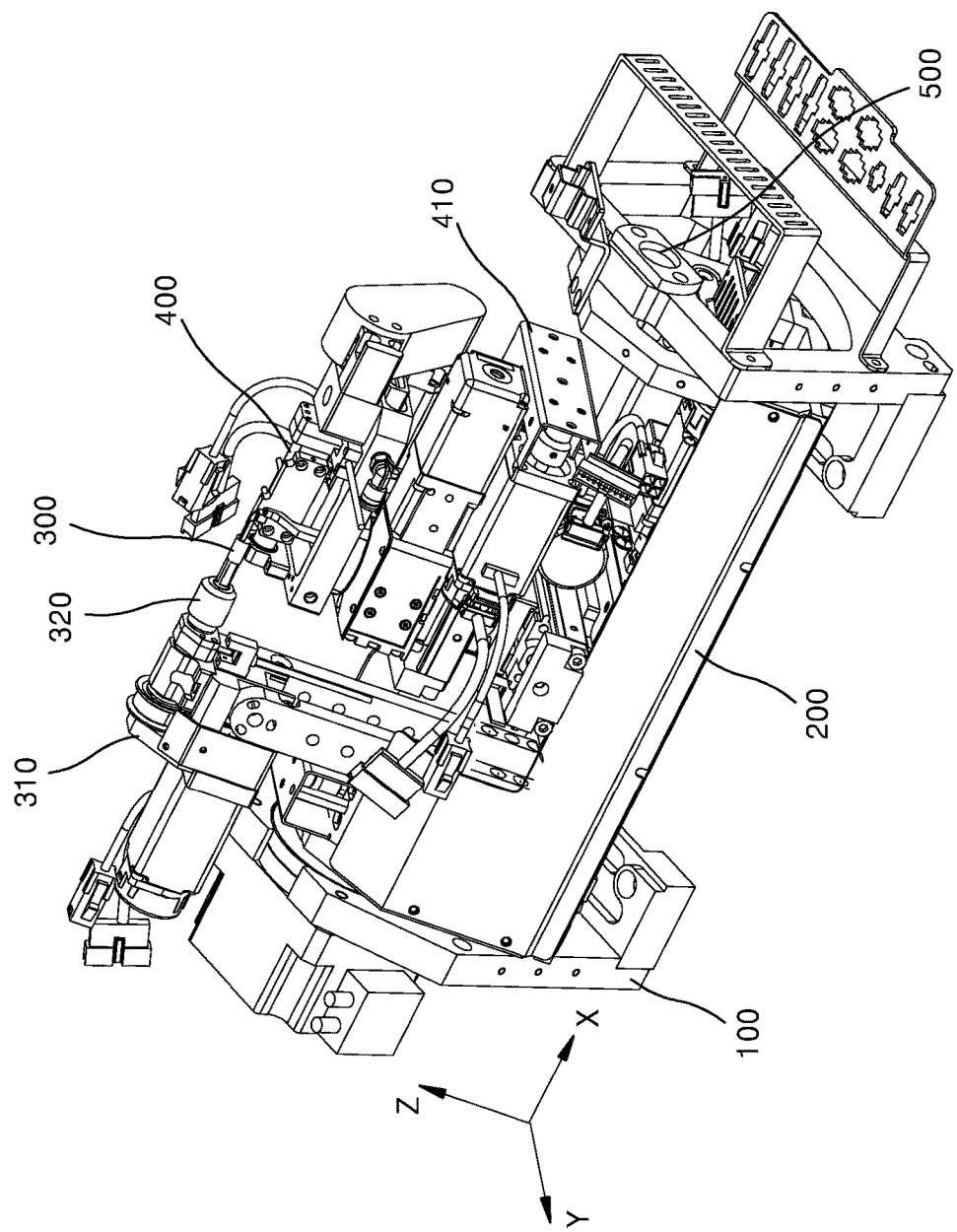

As illustrated in FIG. 7, when the tilt unit 500 rotates the support bracket 200 with respect to the base 100, the first fixing member 300 and the second fixing member 400 mounted on the support bracket 200 are rotated together. As the first fixing member 300 and the second fixing member 400 are rotated, the first part 10 and the second part 20 are also rotated.

The controller 900 operates the tilt unit 500 to rotate the support bracket 200 such that a plane where the inclined leads 12 of the first part 10 and the inclined pads 22 of the second part 20 face each other is horizontal. That is, the tilt unit 500 rotates the support bracket 200 such that the plane where the inclined leads 12 of the first part 10 and the inclined pads 22 of the second part 20 face each other faces the bonding head 600. In this state, the bonding head 600 ejects melted solder balls so as to bond the inclined leads 12 of the first part 10 and the inclined pads 22 of the second part 20 to each other.

When bonding between the plurality of inclined leads 12 of the first part 10 and the plurality of inclined pads 22 of the second part 20 is completed, the tilt unit 500 is operated to bond the horizontal leads 13 and the horizontal pads 23. That is, the tilt unit 500 rotates the support bracket 200 such that a plane where the horizontal leads 13 of the first part 10 and the horizontal pads 23 of the second part 20 face each other is horizontal. When the plane where the horizontal leads 13 of the first part 10 and the horizontal pads 23 of the second part 20 face each other faces the bonding head 600, the bonding head 600 ejects melted solder balls so as to bond the plurality of horizontal leads 13 of the first part 10 and the plurality of horizontal pads 23 of the second part 20 to each other.

In an operation of bonding two parts by using a melted material such as solder balls, it is important to align a bonding surface of the parts to be on a horizontal plane. In particular, like in the present disclosure, when the first part 10 and the second part 20 are three-dimensional such that the inclined leads 12 and the horizontal leads 13 are respectively inclined, and the inclined pads 22 and the horizontal pads 23 are also inclined, the first part 10 and the second part 20 may be bonded by accurately aligning them with respect to each other by using the above-described structure. That is, after aligning the first part 10 and the second part 20 with respect to each other based on the support bracket 200, by tilting the support bracket 200 and the elements mounted to the support bracket 200 as a whole, a space and direction for the bonding head 600 to perform a bonding operation may be effectively provided.

When bonding of the first part 10 and the second part 20 is completed, an unloading unit 2000 that is separately provided unloads the first part 10 and the second part 20 bonded to each other. The first transporting unit 310 and the second transporting unit 410 respectively move the first fixing member 300 and the second fixing member 400 to initial positions thereof. The base moving device 110 moves the base 100 to the loading unit 1000 to prepare a next operation.

While the present disclosure has been described with reference to preferred embodiments above, the scope of the present disclosure is not limited to the embodiments described above and illustrated in the drawings.

For example, the first part 10 and the second part 20 described above are merely an example, and the present disclosure may be applied when other electronic parts are bonded to an inclined bonding surface of a three-dimensional part. In addition, as a main characteristic of the present disclosure is that the inclined leads 12 and the inclined pads 22 inclined with respect to a plane where the first part 10 and the second part 20 face each other may be bonded to each other, and thus, the present disclosure may also be applied to a first part and a second part that do not include the horizontal leads 13 and the horizontal pads 23 described above.

In addition, while the base 100 is described above to be transported using the base moving device 110 below the inspection camera 800, the pump head 700, and the bonding head 600, the locations of the base 100, the inspection camera 800, the pump head 700, and the bonding head 600 may be modified in various manners. In addition, an apparatus for bonding a flexible part including inclined leads, which includes a fixed base without a base moving device may also be configured.

In addition, while it is described above that images of parts are captured using the inspection camera 800 first, and then an epoxy is dispensed to perform a bonding operation, the scope of the present disclosure is not limited to the above-described embodiment, and the process order may be modified in various manners. For example, an apparatus for bonding a flexible part including inclined leads may also be configured without the pump head 700. In this case, the apparatus for bonding a flexible part including inclined leads according to the present disclosure performs only a bonding operation without coating a second part with an adhesive. An operation of coating an adhesive between a first part and a second part may be performed using another additional apparatus, or a coating operation as above may not be necessary.

In addition, while the first fixing member 300 is described as having a shape extending in the X-direction, the shape of the first fixing member 300 may have various shapes In addition, while the first fixing member 300 is described as clamping the first part 10 by using a vacuum adsorption method, clamping methods performed by the first fixing member 300 to clamp the first part 10 may be various. For example, when a first part is a metal material, the first fixing member 300 may clamp the first part by using a magnetic force.

In addition, while the second fixing member 400 is described above as fixing the second part 20 by inserting the second part 20 into a recess having a shape corresponding to that of the second part 20 and adsorbing the second part 20, various methods such as a vacuum adsorption method and an adsorption method by using a magnetic force may be used as a method performed by the second fixing member 400 to clamp the second part 20.

In addition, while the second transporting unit 410 is described above as moving the second fixing member 400 in the-X direction and the Y-direction, and the second rotating unit 420 is described as rotating the second fixing member 400 with respect to the support bracket 200 about a rotational direction in the X-direction and a rotational direction in the Y-direction, directions in which the second transporting unit and the second rotational unit transport the second fixing member to align parts with respect to each other and methods of the transporting may be various.

In addition, while the first transporting unit 310 is described above to be raised with respect to the support bracket 200 so as to make the first part 10 clamped by the first fixing member 300 to approach the second part 20, the first transporting unit may be configured in various configurations in which the first part approaches the second part.

In addition, while it is described above that parts are aligned such that the main body 11 of the first part 10 and the bonding portion 21 of the second part 20 are parallel, according to circumstances, in order to further simplify a bonding operation, the controller may control the first transporting unit and the second transporting unit such that the main body of the first part and the bonding portion of the second part are not parallel. In this case, a plane where the inclined leads of the first part and the inclined pads of the second part face each other may not be in parallel with each other. The first transporting unit may transport the first fixing member such that the inclined leads of the first part approach the inclined pads of the second part while the inclined leads are inclined at a relatively great or small angle with respect to the inclined pads of the second part so as to bond the inclined leads and the inclined pads first, and then bond the horizontal leads and the horizontal pads later.

In addition, while the apparatus for bonding a flexible part including inclined leads, which includes the first rotating unit 320 and the second rotating unit 420 is described above as an example, one of the first rotating unit 320 and the second rotating unit 420 may be omitted, or according to circumstances, both the first rotating unit 320 and the second rotating unit 420 may be omitted.

In addition, while it is described above that the inspection camera 800 is included, more cameras may be included to respectively capture images of parts. That is, an apparatus for bonding a flexible part including inclined leads may also be configured by adding cameras to the pump head and the bonding head so as to respectively perform an adhesive coating operation and a bonding operation by determining locations and directions of the first and second parts in real time.

In addition, while the pump head 700 is described above as dispensing an epoxy to a side surface of the second part 20 above, various adhesive materials other than an epoxy may also be used as the adhesive coated using the pump head 700.

In addition, an apparatus for bonding a flexible part including inclined leads may also be configured to include a bonding head other having various structures and using other various methods to bond inclined leads, inclined pads, horizontal leads, and horizontal pads, than the bonding head 600 described above.

According to the apparatus for bonding a flexible part including inclined leads of the present disclosure, an electronic part may be easily bonded to a part having an inclined surface.

What is claimed is:

1. An apparatus for bonding a flexible part including inclined leads, wherein the apparatus bonds at least one inclined lead of a first part inclined with respect to a plane where the first part and a second part face each other, to at least one inclined pad of the second part formed to face the at least one inclined lead, the apparatus comprising:
   a base;
   a support bracket rotatably mounted with respect to the base;
   a first fixing member clamping the first part;
   a second fixing member clamping the second part;
   a first transporting unit transporting the first fixing member relative to the support bracket in a direction in which the first fixing member moves near the second part clamped by the second fixing member;
   a second transporting unit transporting the second fixing member relative to the support bracket such that a location of the second part is aligned with respect to the first part clamped by the first fixing member;
   a bonding head bonding the at least one inclined lead of the first part to the at least one inclined pad of the second part; and
   a tilt unit rotating the support bracket with respect to the base such that the at least one inclined lead of the first part and the at least one inclined pad of the second part face the bonding head.

2. The apparatus for bonding a flexible part including inclined leads of claim 1, further comprising a first rotating unit rotating the first fixing member with respect to the first transporting unit so as to adjust an angle of the first part clamped by the first fixing member.

3. The apparatus for bonding a flexible part including inclined leads of claim 2, further comprising a second rotating unit rotating the second fixing member with respect to the second transporting unit so as to adjust an angle of the second part clamped by the second fixing member.

4. The apparatus for bonding a flexible part including inclined leads of claim 2, wherein the first rotating unit rotating the first fixing member such that the first part clamped by the first fixing member faces the second part clamped by the second fixing member having a location aligned using the second transporting unit.

5. The apparatus for bonding a flexible part including inclined leads of claim 3, further comprising:
   an inspection camera capturing images of the first part fixed to the first fixing member and the second part fixed to the second fixing member; and
   a controller receiving the images captured using the inspection camera to control operations of the first rotating unit, the second rotating unit, the first transporting unit, the second transporting unit, and the tilt unit.

6. The apparatus for bonding a flexible part including inclined leads of claim 5, further comprising a pump head coating an adhesive on the second part such that the first part is adhered to the second part.

7. The apparatus for bonding a flexible part including inclined leads of claim 5, wherein the at least one inclined lead of the first part includes a plurality of inclined leads, and the at least one inclined pad of the second part also includes a plurality of inclined pads, wherein the inspection camera captures an image of heights of the plurality of inclined leads of the first part clamped by the first fixing member rotated by using the first rotating unit, wherein the controller adjusts a distance of the first part from the second part by operating the first transporting member by considering a difference in the heights of the plurality of inclined leads of the first part captured using the inspection camera.

8. The apparatus for bonding a flexible part including inclined leads of claim 1, wherein the first fixing member clamps the first part by using one of a vacuum adsorption method or a magnetic force adsorption method.

* * * * *